(12) United States Patent
Yoshioka et al.

(10) Patent No.: US 7,205,640 B2
(45) Date of Patent: Apr. 17, 2007

(54) SEMICONDUCTOR DEVICE AND DISPLAY COMPRISING SAME

(75) Inventors: Hiroto Yoshioka, Tenri (JP); Tatsuya Fujita, Soraku-gun (JP); Hisao Ochi, Tenri (JP); Toshinori Sugihara, Tenri (JP); Takeshi Hara, Ikoma-gun (JP); Masashi Kawasaki, 35-1-101, Kawauchimotohasekura Aoba-ku, Sendai-shi Miyagi (JP) 980-0861; Hideo Ohno, 3-33-10, Katsura Izumi-ku, Sendai-shi Miyagi (JP) 981-3134

(73) Assignees: Masashi Kawasaki, Miyagi (JP); Hideo Ohno, Miyagi (JP); Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/515,120

(22) PCT Filed: Mar. 26, 2003

(86) PCT No.: PCT/JP03/03709

§ 371 (c)(1),
(2), (4) Date: Nov. 19, 2004

(87) PCT Pub. No.: WO03/098699

PCT Pub. Date: Nov. 27, 2003

(65) Prior Publication Data
US 2005/0173734 A1    Aug. 11, 2005

(30) Foreign Application Priority Data
May 22, 2002   (JP)   ............................ 2002-148238

(51) Int. Cl.
H01L 23/58   (2006.01)

(52) U.S. Cl. ..................... 257/646; 257/632; 438/197
(58) Field of Classification Search ............... 257/765, 257/771, E23.159, E23.16, E21.28, 614, 257/E33.19
See application file for complete search history.

(56) References Cited

U.S. PATENT DOCUMENTS

| | | |
|---|---|---|
| 6,406,928 B1 * | 6/2002 | Jen et al. ................... 438/30 |
| 6,480,365 B1 * | 11/2002 | Gill et al. .............. 360/324.11 |
| 6,563,174 B2 | 5/2003 | Kawasaki et al. |

(Continued)

FOREIGN PATENT DOCUMENTS

| | | |
|---|---|---|
| EP | 1 134 811 A1 | 9/2001 |
| EP | 1 172 858 A1 | 1/2002 |
| JP | 63-101740 A | 5/1988 |
| JP | 8-264794 | 10/1996 |
| JP | 2002-76356 A | 3/2002 |

OTHER PUBLICATIONS

International Search Report.

*Primary Examiner*—Thao P. Le
(74) *Attorney, Agent, or Firm*—Nixon & Vanderhye P.C.

(57) ABSTRACT

In an inverse-stagger MOSFET (1), a gate insulating layer (4) made of amorphous aluminum oxide is so formed as to face a channel layer (5) which serves as the semiconductor layer, and which is made of zinc oxide. With this arrangement, a defect level at an interface between the channel layer (5) and the gate insulating layer (4) is reduced, thereby obtaining performance equivalent to that of a semiconductor apparatus in which all the layered films are crystalline. This technique is applicable to a staggered MOSFET and the like, and has high versatility.

13 Claims, 5 Drawing Sheets

U.S. PATENT DOCUMENTS

| | | | |
|---|---|---|---|
| 6,721,026 B2 * | 4/2004 | Cheng et al. | 349/141 |
| 2003/0132449 A1 * | 7/2003 | Hosono et al. | 257/103 |
| 2004/0211969 A1 * | 10/2004 | Ishizaki | 257/94 |
| 2005/0145970 A1 * | 7/2005 | Lu et al. | 257/449 |
| 2005/0156268 A1 * | 7/2005 | Chu | 257/478 |
| 2006/0035452 A1 * | 2/2006 | Carcia et al. | 438/608 |

* cited by examiner

SEMICONDUCTOR DEVICE AND DISPLAY COMPRISING SAME

This application is the U.S. national phase of international application PCT/JP03/03709 filed Mar. 26, 2003 which designated the U.S. and claims benefit of JP 2002-148238, dated May 22, 2002, the entire content of which is hereby incorporated by reference.

TECHNICAL FIELD

The present invention relates to a semiconductor apparatus in which a group II oxide is used for a semiconductor layer, and to a display apparatus including the semiconductor apparatus, and in particular to a technique for improving performance of a semiconductor apparatus in which zinc oxide is used for a semiconductor layer.

BACKGROUND ART

In recent years, researches have been carried out to manufacture a semiconductor apparatus in which a group II oxide such as zinc oxide is used as a semiconductor layer. These researches, in which improvement of a semiconductor apparatus is their object or means, have reported a number of high-quality and concrete techniques. Broadly speaking, the techniques show that a performance of the semiconductor apparatus is effectively improved by improving crystallinity of a layered film, by controlling the crystallinity, by performing an interface control accompanied with them, or doping impurity. Based on that, the techniques teach, for achieving the effective improvement, modification in methods for layering films, film materials, and doping materials.

Among these reports, considerable techniques have been elaborated to concrete achievements as filing of patent applications. Here, four conventional techniques (References) are explained.

For example, described in Japanese Laid-Open Patent Application Tokukaisho No. 63-101740 (published on May 6, 1988; hereinafter, referred to as "Reference 1") is a vertical electric field effect transistor gas sensor in which zinc oxide or the like is used as a channel layer.

Further, disclosed in Japanese Laid-Open Patent Application Tokukai No. 2000-150900 (published on May 30, 2000; hereinafter, referred to as "Reference 2") is a technique for improving aperture ratio of a liquid crystal display apparatus by using a transparent transistor by using (i) a transparent semiconductor, made of zinc oxide or the like, for a channel layer of the transistor; and (ii) a transparent insulation oxide for a gate insulating layer, and the like means.

Further, a key point of Japanese Laid-Open Patent Application Tokukai No. 2000-277534 (published on Oct. 6, 2000; hereinafter, referred to as "Reference 3") is that, instead of a sapphire substrate used in many researches, a substrate made of crystalline $ScAlMgO_4$ or the like is used as the base film so that crystal lattice mismatching is eliminated between zinc oxide and the base film. Because of the use of the substrate made of crystalline $ScAlMgO_4$ or the like, the crystal lattice mismatching is dramatically improved to be 0.13%. This technique is excellent because the Reference 3 describes that a layer of substantially single crystal zinc oxide can be obtained by layering zinc oxide on the substrate. In other words, the Reference 3 describes that crystallinity improvement of zinc oxide is a key for performance improvement of a semiconductor apparatus. Therefore, in order to improve crystallinity of zinc oxide, the substrate that is made of $ScAlMgO_4$ or the like with some consideration with respect to the crystal lattice mismatching is used as the base film. With this arrangement, the crystallinity of zinc oxide is dramatically improved.

Disclosed in Japanese Laid-Open Patent Application Tokukai 2002-76356 (published on Mar. 15, 2002; hereinafter, referred to as "Reference 4") is a method for doping 3d transition metal element to zinc oxide so that ON-OFF ratio property and a mobility property of a transistor, which includes a transparent channel layer made of zinc oxide or the like, will be improved.

In a vertical type transistor of a specific example of Reference 1, aluminum oxide is used as a substrate, and zinc oxide is layered on the substrate. It is assumed that the arrangement is made, in consideration of crystal lattice matching, for the purpose of crystallinity improvement of zinc oxide.

Further, in Reference 3, because the crystal lattice matching is taken into consideration, there is a premise that zinc oxide, $ScAlMgO_4$, and the like are crystals.

These are because, as described above, there is a premise that a performance of a semiconductor apparatus is effectively improved by improving crystallinity of a layered film, controlling the crystallinity, and performing an interface control accompanied with them.

Further, in specific examples of References 2 and 4, zinc oxide is used as a channel layer, and a gate insulating layer made of aluminum oxide, $ScAlMgO_4$, or the like is formed on the channel layer. In this way, the transparent transistor is prepared.

References 2 and 4 describe that material of the gate insulating film is transparent, and exemplifies a plurality of the transparent materials. Aluminum oxide is one of them. However, the aluminum oxide is exemplified not in terms of the interface control between the gate insulating film and the channel layer, but exemplified as a general material of a transparent insulating film. By way of exception, $ScAlMgO_4$ is described as a transparent insulating material for the crystal lattice matching. Therefore, in this case, there is a premise that the transparent material is crystal.

However, in the case where a crystal material is used for the material as described in References, there are following restrictions 1 through 3:
1. It is difficult to form a film.
2. It is difficult to use a large substrate.
3. Order of forming films is fixed.

The restriction 1 is specifically explained as follows. For forming a predetermined crystalline film of zinc oxide or the like, determination of a precision apparatus and a precision condition, and secure maintenance of them are indispensable, as in the pulse laser deposition method or the like. Therefore, the techniques need to be more modification for mass production. Note that the same is true in the film formation of the substrate made of $ScAlMgO_4$.

As for the restriction 2, although determination of a precision apparatus and a precision condition, and the secure maintenance of them are indispensable for forming the film made of predetermined crystal of zinc oxide, $ScAlMgO_4$, or the like, it is difficult that a large substrate for a liquid crystal fulfills the requisites. Therefore, the techniques also need to be more improved for wider application to various types of products.

The restriction 3 is explained as follows. The formation of the film made of the predetermined crystalline of zinc oxide or the like, requires the formation of the substrate made of the predetermined crystal of $ScAlMgO_4$ or the like as the base film, for the sake of the crystal lattice matching.

Therefore, the base film of ScAlMgO$_4$ inevitably has to be formed before the formation of the film of zinc oxide or the like. Therefore, for example, in the case of an FET, the techniques can be applied only to a staggered FET, in which a gate electrode is provided opposite to a substrate. This is not preferable because this narrows a freedom in designing a semiconductor apparatus.

Although the Reference 2 discloses the technique for improving performance of a semiconductor apparatus having a transistor in which zinc oxide is used, the Reference 2 does not discuss an improvement of the transistor itself, to simplification of manufacturing process, or the like.

Further, the Reference 4 discloses the technique for improving ON-OFF ratio property and mobility property of the transistor, however, the Reference 4 does not discuss the interface control, which affects a threshold shift and the like of electric properties of the transistor, particularly the interface control between the gate insulating film and the channel layer in the transistor.

As described above, the conventional techniques described in the References have high quality, however, have problems in their applications.

DISCLOSURE OF INVENTION

An object of the present invention is to provide (i) a semiconductor apparatus, having a semiconductor layer that contains a group II oxide, whose performance is improved by a versatile technique; and (ii) a display apparatus including the semiconductor apparatus.

A semiconductor apparatus, of the present invention, including a semiconductor layer that contains a group II oxide, wherein: the semiconductor layer has at least one surface on which amorphous aluminum oxide (Al$_2$O$_3$) is layered.

For the performance improvement of the semiconductor apparatus including the semiconductor layer containing a group II oxide such as zinc oxide or the like, the conventional techniques adopt the methods such as the crystallinity improvement, the crystallinity control of layered films, the interface control accompanied with them, and the impurity doping. On the contrary, in the arrangement according to the present invention, amorphous aluminum oxide is layered on at least one surface of the semiconductor layer. The arrangement allows the semiconductor apparatus to have performance equivalent to a semiconductor apparatus in which all the layered films are crystalline. Such performance cannot be obtained without the amorphous aluminum oxide film because the amorphous aluminum oxide layered on the semiconductor layer containing the group II oxide reduces a defect level at an interface between the semiconductor layer and the amorphous aluminum oxide. The term "defect level" indicates an electronic defect which obstructs a carrier movement in the semiconductor layer.

Therefore, it is possible to realize a semiconductor apparatus (i) in which the crystallinity improvement of the semiconductor layer made of zinc oxide or the like is less required than a conventional semiconductor apparatus; (ii) in which the film can be formed with ease; and (iii) in which a group II oxide that can be used in a large substrate with ease is used for the semiconductor layer. Further, it is possible to realize a semiconductor apparatus which has such freedom in designing that order of forming films is not fixed, and has a high versatility.

Note that the technique of the present invention may be combined with other technique. See an example of a staggered FET in which a gate electrode is provided opposite to a substrate. In the staggered FET, an amorphous aluminum oxide layer according to the present invention may be formed as a gate insulating film between the substrate and a semiconductor layer by using the technique of the Reference 3.

It is preferable that the semiconductor apparatus of the present invention is arranged so that the group II oxide is zinc oxide. The group II oxide for the semiconductor layer may be zinc oxide (ZnO), magnesium zinc oxide (Mg$_x$Zn$_{1-x}$O), cadmium zinc oxide (Cd$_x$Zn$_{1-x}$O), cadmium oxide (CdO), or the like. Among the group II oxides, however, zinc oxide is particularly suitable for the semiconductor layer, and is particularly expected to improve properties of the semiconductor apparatus.

Further, a display apparatus of the present invention includes the semiconductor apparatus.

According to the arrangement, the semiconductor apparatus of the present invention can have performance equivalent to a semiconductor apparatus in which all the layered films are crystalline. Further, the semiconductor apparatus ensures easy film forming. Furthermore, the semiconductor apparatus can deal with a large substrate with ease. Therefore, the semiconductor apparatus is suitably applicable to a display apparatus such as a liquid crystal display apparatus, in particular, to a large display apparatus.

Additional objects, features, and strengths of the present invention will be made clear by the description below. Further, the advantages of the present invention will be evident from the following explanation in reference to the drawings.

BEST MODE FOR CARRYING OUT THE INVENTION

[First Embodiment]

Figure 1:
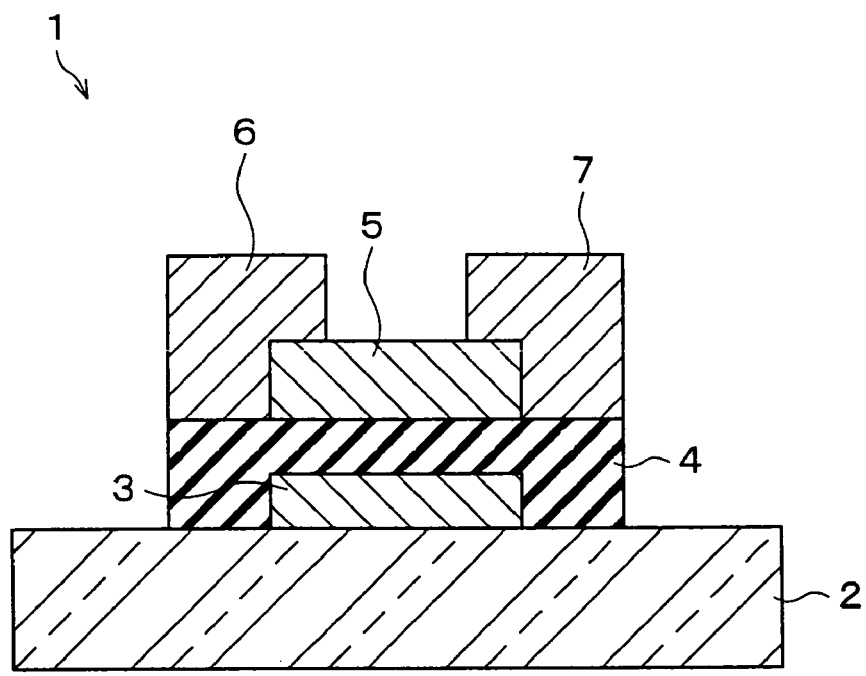
FIG. 1 is a cross sectional view illustrating a structure of an FET, which is a semiconductor apparatus of an embodiment of the present invention.

The following description discusses an embodiment of the present invention with reference to FIG. 1.

FIG. 1 is a cross sectional view illustrating a structure of a field effect transistor (FET) 1, which is a semiconductor apparatus of an embodiment of the present invention. The FET 1 is an inverse-staggered MOSFET (metal oxide semiconductor field effect transistor). Schematically, in the FET 1, a gate layer 3, a gate insulating layer 4, a channel layer 5 are layered on a substrate 2 in this order. And then, a source layer 6 and a drain layer 7 are layered thereon.

The substrate 2 serves as a base on which the layers are provided. A material of the substrate 2 may be silicon wafer, glass, plastic, or the like, and is not particularly limited in the present invention. The gate layer 3 is a gate wire for driving the FET 1, and a material of the gate layer 3 is a conductive material such as metal, semiconductor, or the like, and is not particularly limited. Normally, the substrate 2 has a film thickness not less than 0.1 mm but not more than 2 mm, and the gate layer 3 has a film thickness not less than 50 nm but not more than 300 nm, however, they are not particularly limited.

The gate insulating layer 4 is in accordance with the present invention, and is made of amorphous aluminum oxide ($Al_2O_3$). A film thickness of the gate insulating layer 4 made of amorphous aluminum oxide is not particularly limited. However, in the view of withstand voltage, the gate insulating layer 4 preferably has a film thickness of 100 nm or greater, and more preferably 200 nm or greater. Further, in order to obtain sufficient capacitance, the gate insulating layer 4 preferably has a film thickness of 700 nm or less, and more preferably 600 nm or less.

The channel layer 5 is a semiconductor layer containing a group II oxide, such as zinc oxide (ZnO), magnesium zinc oxide ($Mg_xZn_{1-x}O$), cadmium zinc oxide ($Cd_xZn_{1-x}O$), cadmium oxide (CdO), or the like; or these group II oxides. Zinc oxide is particularly suitable for the channel layer 5. Normally, the channel layer 5 has a film thickness not less than 100 nm but not more than 200 nm, but the film thickness is not particularly limited.

The channel layer 5 may be crystalline for better mobility. Alternatively, the channel layer 5 may be amorphous, taking grain boundary scatterings into consideration. In the case where the channel layer 5 is crystalline, the channel layer 5 may be arranged to have an adequate alignment property.

Rendering crystallinity and alignment property to the channel layer 5 may be carried out as follows. In case where the channel layer 5 is made of, for example, zinc oxide, and the sputtering method is used, for example, deposition rate is adjusted lower than the case where crystallinity and alignment are not rendered. This is because zinc oxide is apt to have crystallinity and the alignment property. In this case, the mobility in the FET (FET1) is expected to be improved. For example, according to the following experiment result found by the inventors of the present invention, the deposition rate in a range of 10 Å/s to 20 Å/s (1 Å=$10^{-10}$ m) dramatically increased the mobility (field effect mobility) by a digit, thereby obtaining mobility of approximately 4 $cm^2$/V·s.

The source layer 6 will function as a source wire, and the drain layer 7 will function as a drain wire. A material of them is a conductive such as metal, semiconductor, or the like, and is not particularly limited as long as the material allows the source layer 6 and the drain layer 7 to make ohmic-contact with the channel layer 5. For example, the material may be (i) a metal such as aluminum (Al), molybdenum (Mo), tantalum (Ta), titanium (Ti), silver (Ag) or the like; (ii) a transparent conductive film made of indium tin oxide (ITO), indium zinc oxide (IZO) or the like; or (iii) a conductive film made of ZnO doped with an impurity. Normally, the source layer 6 and the drain layer 7 have a film thickness not less than 50 nm but not more than 300 nm, respectively, however, their film thickness is not particularly limited.

The point of the arrangement is that the FET 1 is so arranged that the gate insulating layer 4 is made of amorphous aluminum oxide, and the channel layer 5 made of zinc oxide or the like is continuously layered on the gate layer 4. This combination ensures massive reduction of a defect level at the interface between the gate insulating layer 4 and the channel layer 5. On this account, the performance of the FET 1 is improved. As evidence, a threshold shift, which is due to the defect in the interface between the gate insulating layer and the channel layer, of electric properties of the transistor is suppressed to substantially 0 volt as a result of this combination. On the contrary, with that combination of amorphous silicon nitride and zinc oxide which is often adopted in a liquid crystal panel or the like, the threshold shift is so large as to reach several ten volts. Note that the term "defect level" indicates an electronic defect which obstructs a carrier movement in the channel layer 5.

Table 1 below specifically shows how the FET 1 having the structure (see FIG. 1) effectively improves its electric properties, in accordance with an experiment conducted by the inventors of the present invention. Performance of an FET is indicated by a Vg-Id characteristic which is a current change characteristic, between a source and a drain, with respect to gate voltage. The Vg-Id characteristic may be indicated in threshold voltage, mobility, ON-OFF ratio, and hysteresis. All of them are shown in Table 1.

The experiment could be conducted under experiment conditions described below. That is, the threshold voltage, the mobility, the ON-OFF ratio, and the hysteresis were found by measuring the Vg-Id characteristic with the use of a semiconductor parameter analyzer (provided by the Agilent Technology, model number 4155C).

Note that, zinc oxide was used for the channel layer 5 in each of samples of the experiment.

Specifically, the experiment used FETs, which were respectively arranged such that as shown in FIG. 1, the gate layer 3, the gate insulating layer 4, the channel layer 5, the source layer 6, and the drain layer 7 were layered on the substrate 2 in this order. Each FET is arranged as follows: the substrate 2 was made of no-alkali glass, and had a film thickness of 0.7 mm. The gate layer 3 was made of tantalum (Ta), and had a film thickness of 150 nm. The channel layer 5 was made of crystalline zinc oxide, and had a film thickness of 100 nm. The source layer 6 and the drain layer 7 were made of aluminum (Al), and had film thicknesses of 100 nm, respectively. Meanwhile, the materials listed below were respectively used for the gate insulating layers 4 of the FETs. Each of the gate insulating layers 4 thus prepared had a film thickness of 200 nm.

In the conventional art sample, all the layered films were crystalline. In the sample of the present invention, on the gate insulating layer 4 made of amorphous aluminum oxide (having resistance of $5\times10^{13}$ Ω·cm), crystalline zinc oxide was layered as the channel layer 5, as described above. In the comparative sample, the gate insulating layer 4 was made of amorphous silicon nitride (having resistance of $1\times10^{16}$ Ω·cm), and crystalline zinc oxide was layered on the gate insulating layer 4. Namely, in the comparative sample, the gate insulating layer 4 made of aluminum oxide in the sample of the present invention is replaced by that of amorphous silicon nitride. Further, in the conventional art sample, the gate insulating layer 4 was made of calcium zirconic oxide (having resistance of $3\times10^{14}$ Ω·cm).

TABLE 1

|  | Threshold voltage (V) | ON-OFF ratio | Mobility ($cm^2$/V · s) | Hysteresis |
| --- | --- | --- | --- | --- |
| Conventional art | 0.0 ± 2.0 | $10^8$ | 3.0 to 5.0 | 2.0 V or less |

TABLE 1-continued

| | Threshold voltage (V) | ON-OFF ratio | Mobility ($cm^2/V \cdot s$) | Hysteresis |
|---|---|---|---|---|
| Present invention | 0.0 ± 3.0 | $10^7$ | 3.0 to 4.0 | 3.0 V or less |
| Comparative | 0.0 ± several ten | $10^4$ | 1.0 or less | Several ten volts |

As apparently shown in Table 1, the FET according to the present invention had performance substantially equivalent to that of the conventional FET in which all the layered films are crystalline. Further, it was understood that the gate insulating layer 4 made of amorphous aluminum oxide ensures a massive performance improvement as compared with that gate insulating layer 4 made of the amorphous silicon nitride film, which was described as a comparative example where amorphous aluminum oxide was not used.

As such, by using amorphous aluminum oxide for the gate insulating layer 4, it is possible to obtain an FET having performance substantially equivalent to the FET in which all the layered films are crystalline. Accordingly, it is possible to realize an FET (i) in which the defect at the interface is kept low; (ii) in which crystallinity improvement of the channel layer 5 is less required than in the conventional FET; (iii) in which the films can be formed with ease because the base film is also amorphous; and (iv) in which a group II oxide that can be used in a large substrate with ease is used for the channel layer 5.

Further, by using zinc oxide as the group II oxide, it is possible to expect improvement particularly in the properties of the FET. Further, because the layered aluminum oxide is not crystalline but amorphous, it is easier to form the film, as compared with the conventional techniques, by using an apparatus used for mass production at present, such as the sputtering method.

[Second Embodiment]

Figure 2:
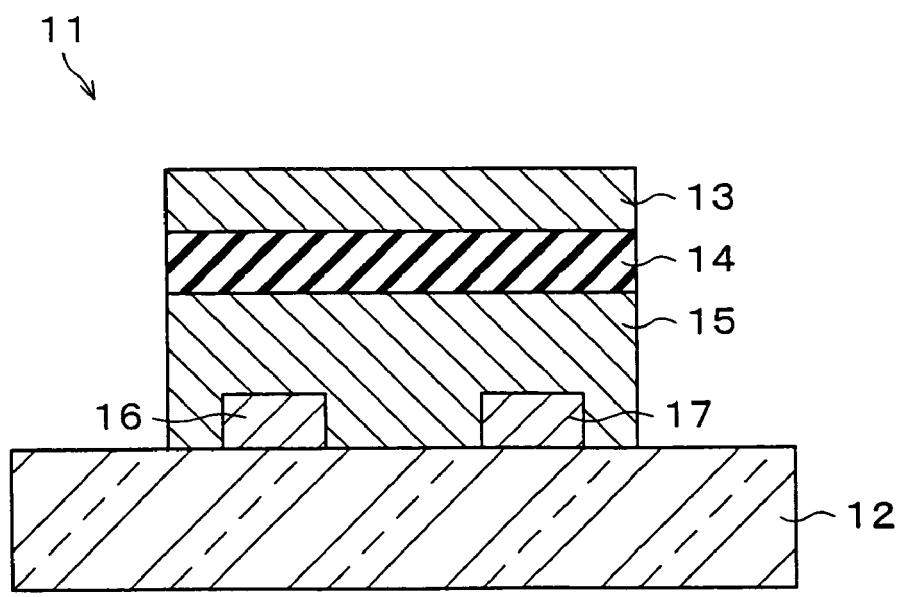
FIG. 2 is a cross sectional view illustrating a structure of an FET, which is a semiconductor apparatus of another embodiment of the present invention.

The following description discusses another embodiment of the present invention with reference to FIG. 2.

FIG. 2 is a cross sectional view illustrating a structure of an FET 11, which is a semiconductor apparatus of the another embodiment of the present invention. The FET 11 is a staggered MOSFET. Schematically, in the FET 11, a source layer 16 and a drain layer 17 are layered on a substrate 12. Then, a channel layer 15, a gate insulating layer 14, and a gate layer 13 are layered in this order on them formed on the substrate 12. The substrate 12 and the layers 13 through 17 have equivalent functions, materials, and thickness to the substrate 2 and the layers 3 through 7 in the FET 1 (see FIG. 1), respectively. Therefore, explanations of them are omitted here.

Apparently from a comparison between the structures of FIG. 1 and FIG. 2, either the gate insulating layers 4 and 14 or the channel layers 5 and 15 can be firstly formed. This ensures more freedom in designing a semiconductor apparatus than the convention techniques. On this account, more options in design, that is, versatility is attained.

Note that, in the staggered FET 11, crystal lattice mismatching between the substrate 12 and the channel layer 15 (semiconductor layer) may be reduced by using the techniques of the foregoing Reference 3. This allows further improvement in crystallinity of the channel layer 15, and further performance improvement. Thus, the technique of the present invention may be combined with other technique(s) as such.

[Third Embodiment]

Figure 3:
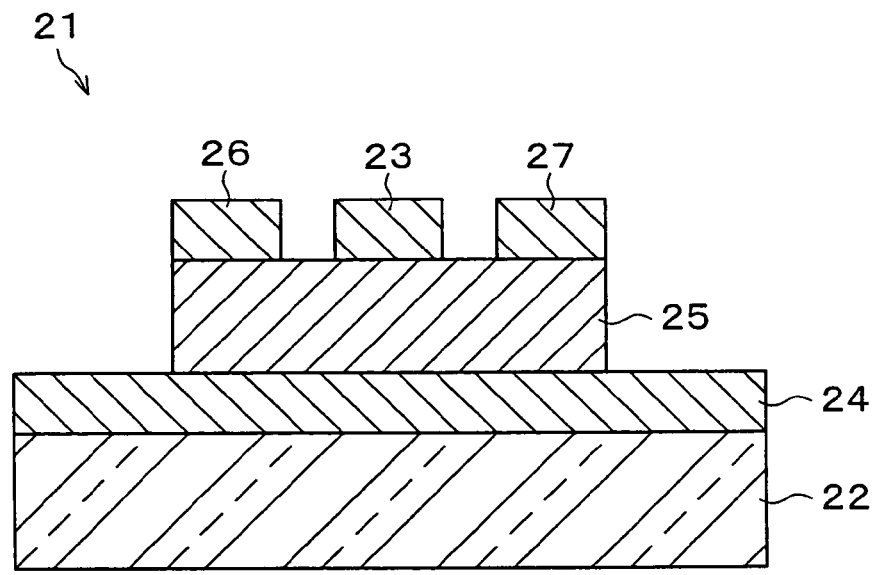
FIG. 3 is a cross sectional view illustrating a structure of an FET, which is a semiconductor apparatus of still another embodiment of the present invention.

The following description discusses still another embodiment of the present invention with reference to FIG. 3.

FIG. 3 is a cross sectional view illustrating a structure of FET 21, which is a semiconductor apparatus of the still another embodiment of the present invention. The FET 21 is a Schottky-gate FET. Schematically, in the FET 21, a priming layer 24, and a channel layer 25 are layered on a substrate 22 in this order. Further, a gate layer 23, a source layer 26 and a drain layer 27 are layered on the channel layer 25.

Like the substrates 2 and 12, the substrate 22 serves as a base for mounting the layers 23 through 27 thereon. A material of the substrate 22 is not particularly limited in the present invention, and may be silicon wafer, glass, plastic, or the like. As described above, in the case where the priming layer 24 is formed on the substrate 22, the substrate 22 normally has a film thickness not less than 0.1 mm but not more than 2 mm, however, the film thickness is not particularly limited.

The gate layer 23 is a gate wire for driving the FET 21, and is made of a conductive material, such as metal, semiconductor, or the like. However, the material of the gate layer 23 is not particularly limited as long as the material allows the gate layer 23 to make Schottky-contact with the channel layer 25, and may be, for example, gold (Au), platinum (Pt), or the like. As in the First Embodiment, the gate layer 23 normally has a film thickness not less than 50 nm but not more than 300 nm, however, the film thickness is not particularly limited.

The priming layer 24 is a film for an interface control between the substrate 22 and the channel layer 25, and is made of amorphous aluminum oxide. A film thickness of the priming layer 24 is not particularly limited. However, in the view of securing properties of amorphous aluminum oxide, the film thickness is preferably 5 nm or greater, and is more preferably 10 nm or greater. In cases where the priming layer 24 has a film thickness of less than 5 nm, its film thickness becomes uneven. This would possibly cause insufficient reduction of a defect level at the interface. Also, in the view of manufacturing efficiency, the priming layer preferably has a film thickness of 1 μm or less, and more preferably has 500 nm or less.

Like the channel layers 5 and 15, the channel layer 25 is made of zinc oxide or the like, and may be crystalline or amorphous. In the case where the channel layer 25 is crystalline, the channel layer 25 may be arranged to have an adequate alignment property. Further, as in the First Embodiment, the channel layer 25 normally has a film thickness not less than 100 nm but not more than 200 nm, however, the film thickness is not particularly limited.

The source layer 26 will function as a source wire, whereas the drain layer 27 will function as a drain wire. They are made of a conductive material such as metal, semiconductor, or the like. Their material is not particularly limited as long as the material allows the source layer 26 and the drain layer 27 to make ohmic-contact with the channel layer 5. As in the First Embodiment, the source layer 26 and the drain layer 27 have film thicknesses not less than 50 nm but not more than 300 nm, respectively, however, their film thicknesses are not particularly limited.

A point of the FET 21 is that amorphous aluminum oxide is used as the priming layer 24 for the interface control between the substrate 22 and the channel layer 25, as shown in FIG. 3. As such, the aluminum oxide film is not necessarily used as the gate insulating layer. In other words, by layering the film on at least one surface of the semiconductor layer containing a group II oxide such as zinc oxide, a defect level at the semiconductor layer is reduced.

In the aforementioned descriptions, three different types of FETs are exemplified. However, the present invention is not particularly limited to these, and is applicable to any cases where a semiconductor apparatus is manufactured by forming a layer of a semiconductor layer containing a group II oxide, and a layer of a conductor; an insulator; and the like.

[Fourth Embodiment]

Figure 4:
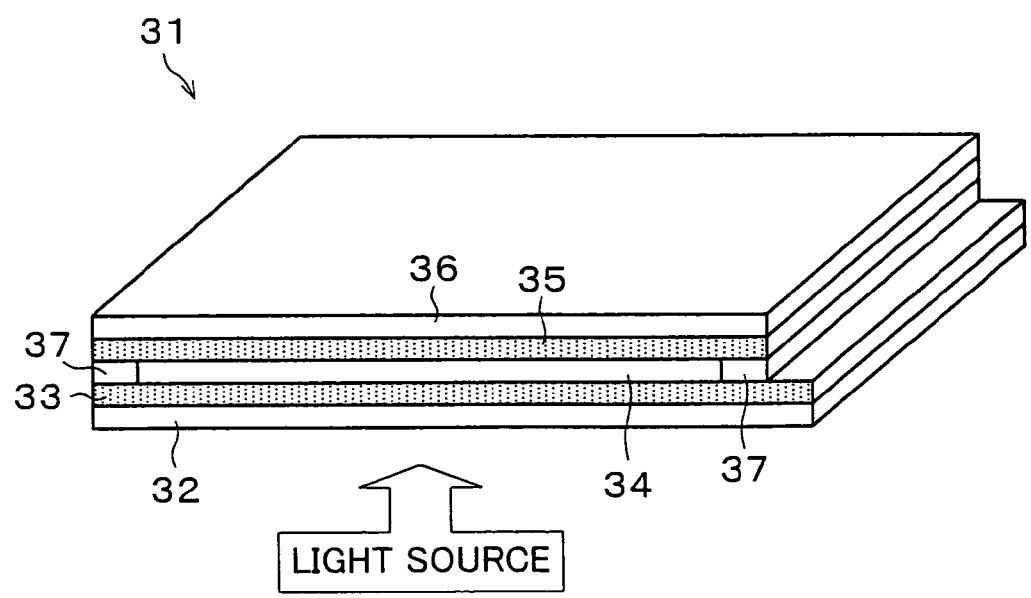
FIG. 4 is a perspective view schematically illustrating an active matrix liquid crystal display apparatus, which is an example how the FETs shown in FIG. 1 through FIG. 3 are used.
Figure 5:
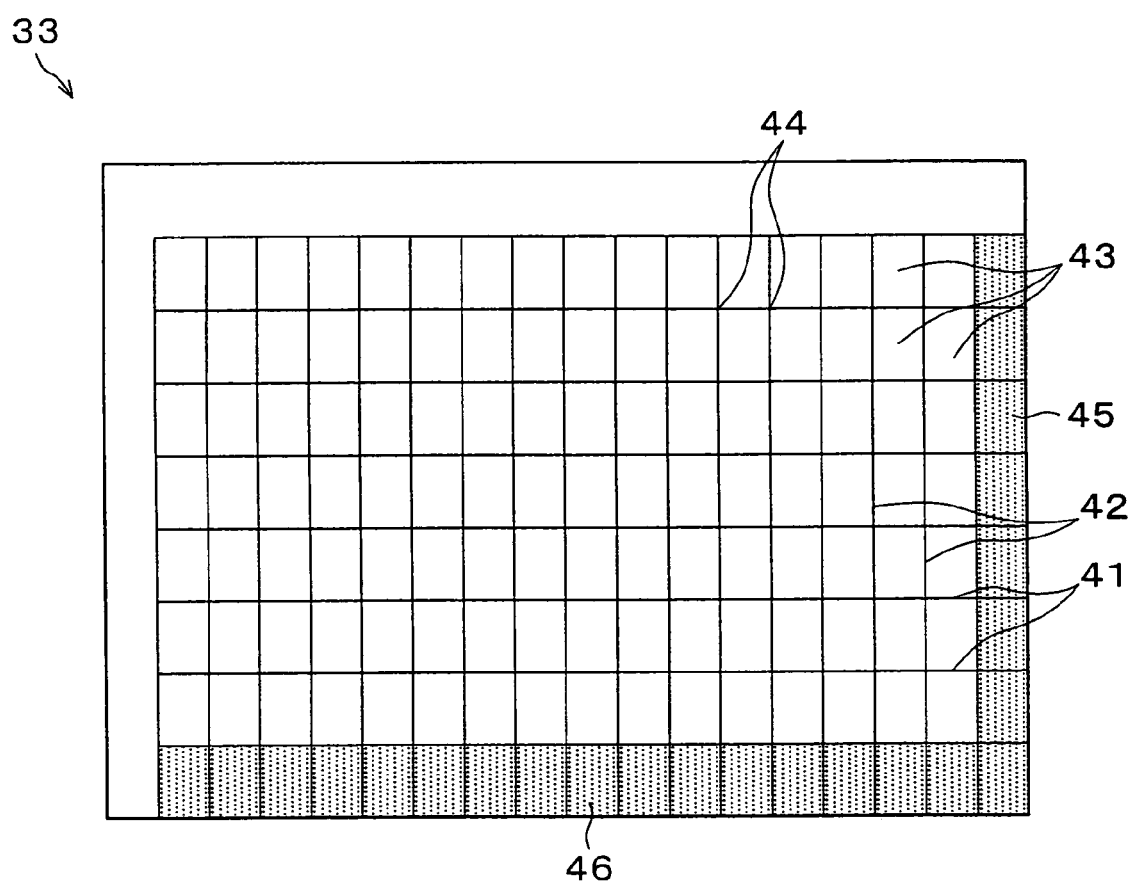
FIG. 5 is a front view illustrating a TFT substrate of the liquid crystal apparatus shown in FIG. 4.
Figure 6:
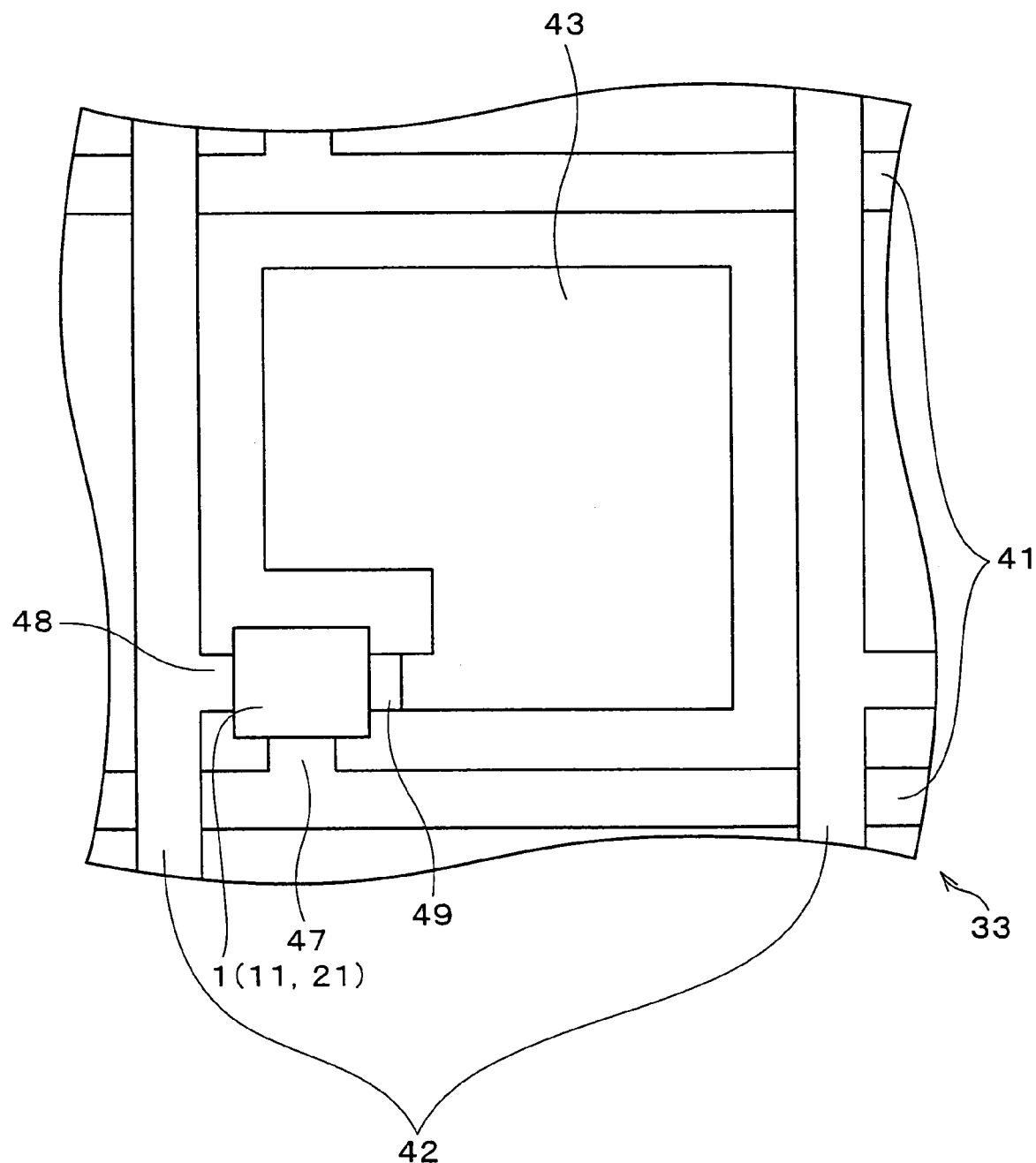
FIG. 6 is a front view illustrating a pixel area in the FET substrate shown in FIG. 5.

With reference to FIG. 4 through FIG. 6, the following description discusses a display apparatus including a semiconductor apparatus of the present invention. Note that, for ease of explanation, materials having the equivalent functions as those shown in the drawings pertaining to the foregoing First through Third Embodiments will be given the same reference symbols, and explanation thereof will be omitted here.

FIG. 4 is a perspective view schematically illustrating an active matrix liquid crystal display apparatus 31 including FETs 1, 11, or 21. Schematically, in the liquid crystal display apparatus 31, a polarizing plate 32, a TFT (thin film transistor) substrate 33, a liquid crystal layer 34, a color filter substrate 35, and a polarizing plate 36 are layered in this order.

The polarizing plates 32 and 36 polarize light from a light source. In response to various types of signals from outside, the TFT substrate 33 applies a voltage for driving the liquid crystal layer 34 to display. The FET 1, 11, or 21 is used as a TFT.

The liquid crystal layer 34 changes the polarized light in accordance with the voltage applied from the TFT substrate 33. The color filter substrate 35 is a substrate for coloring the polarized light. The polarizing plate 36 is a substrate for controlling passing-through and shielding-off of the polarized light. On a peripheral portion of the liquid crystal layer 34, a liquid crystal sealing layer 37 is formed to seal the liquid crystal layer 34.

Therefore, when the TFT substrate 33 applies a voltage to the liquid crystal layer 34 in response to a signal from outside, the liquid crystal layer 34 changes the polarized light, and the polarizing plate 36 causes the polarized light thus changed to pass through and to be shielded off. This realizes a display that corresponds to the signal from outside.

FIG. 5 is a front view of the TFT substrate 33. On the TFT substrate 33, a plurality of gate wires 41 and a plurality of source wires 42 are crossed orthogonal to one another. Areas sectioned by the gate wires 41 and the source wires 42 become pixels, and pixel electrodes 43 are formed in the areas, respectively. The FET 1, 11, or 21 is provided on intersectional sections 44 of the gate wires 41 and the source wires 42. The FET 1, 11, or 21 writes image data in the pixel electrodes 43 that corresponds to pixels selected by the gate wires 41, the image data being provided from the source wires 42.

The TFT substrate 33 has, on its peripheral portion, terminal sections 45 and 46, to which driver element is connected. Via the driver element, the signal from outside is supplied to the gate wires 41 and the source wire 42. Because the present invention ensures an FET to have performance equivalent to an FET in which all the layered films are crystalline, the driver element may be formed in one piece with the TFT substrate 33. In this case, the FETs of the driver element are formed in the terminal sections 45 and 46.

FIG. 6 is a front view of an pixel area of the TFT substrate (see FIG. 5). Each of the pixel areas is surrounded by two gate wires 41 and two source wires 42. In the pixel area, a gate electrode 47 is so formed as to be in a contact with each of the gate wires 41, a source electrode 48 is so formed as to be in contact with each of the source wire 42, and a drain electrode 49 is so formed as to be in contact with each of the pixel electrodes 43. In the FET 1, the gate electrode 47, the source electrode 48, and the drain electrode 49 are connected to the gate layer 3, the source layer 6, and the drain layer 7, respectively. In the FET 11, the gate electrode 47, the source electrode 48, and the drain electrode 49 are connected to the gate layer 13, the source layer 16, and the drain layer 17, respectively. In the FET 21, the gate electrode 47, the source electrode 48, the drain electrode 49 are connected to the gate layer 23, the source layer 26, and the drain layer 27, respectively. With the arrangements, the FETs 1, 11 or 21 are driven.

Note that the present invention is suitably applicable not only to an active matrix liquid crystal display apparatus, but also to any kinds of display apparatus including a substrate on which a semiconductor layer containing a group II oxide, and layers of a semiconductor, a conductor, an insulator, and the like are formed.

[Fifth Embodiment]

The present embodiment verifies a relation between resistance of amorphous aluminum oxide and hysteresis in Vg-Id characteristic of an FET. Note that, for ease of explanation, materials having the equivalent functions as those shown in the drawings pertaining to the foregoing First through Fourth Embodiments will be given the same reference symbols, and explanation thereof will be omitted here.

Table 2 below shows a relation, in the FET 1 (see FIG. 1), between (i) resistance of amorphous aluminum oxide of the gate insulating layer 4 and (ii) hysteresis in the Vg-Id characteristic of the FET. Note that, except that the resistance of the amorphous aluminum oxide was changed as shown in Table 2, a condition of measurement was the same as that of the First Embodiment. Note also that the resistance (see Table 2) of the amorphous aluminum oxide was measured according to the mercury probe method with the use of "495 C-V System (product name)", provided by the SOLID STATE MEASUREMENT INC.

TABLE 2

| Resistance of aluminum oxide (Ω · cm) | Hysteresis (V) |
|---|---|
| $2.3 \times 10^{14}$ | 0.3 |
| $1.2 \times 10^{14}$ | 1.0 |
| $1.3 \times 10^{13}$ | 3.3 |
| $2.6 \times 10^{12}$ | 10.1 |

As shown in Table 2, as the resistance of the aluminum oxide increases, the hysteresis of the FET (FET1) decreases. The hysteresis of the FET represents the defect level at the interface between the semiconductor layer and the insulating layer. In other words, when the hysteresis is small, the defect level at the interface is small. Therefore, smaller hysteresis is preferable for performance of the FET.

As shown in Table 1 of the First Embodiment, the FET can be put into practical use if the hysteresis of the FET is 3V or less. However, in the view of securing stable characteristics of the FET, it is preferable, for practical use, that the hysteresis is approximately 1V or less. Therefore, as shown in Table 2, the amorphous aluminum oxide preferably has resistance of $1 \times 10^{14}$ Ω·cm or greater, to be more exact, $1.2 \times 10^{14}$ Ω·cm, and more preferably has resistance of $2 \times 10^{14}$ Ω·cm or greater.

The same is true is in the FET 11 (see FIG. 2) and the FET 21 (see FIG. 3), in both of which the interface is formed between the amorphous aluminum oxide (the gate insulating layer 14 or the priming layer 24) and the semiconductor layer (the channel layer 15 or 25).

Note that, because the hysteresis of the FET represents the defect level at the interface between the semiconductor layer and the insulating layer, it is preferable for the amorphous aluminum oxide to have larger resistance. However, an upper limit of the resistance for obtaining amorphous aluminum is $2\times10^{17}$ $\Omega\cdot$cm.

Note also that the resistance of the amorphous aluminum oxide can be changed by, for example, varying oxygen partial pressure under the deposition atmosphere. Specifically, the resistance of the amorphous aluminum oxide can be increased, for example, by decreasing the oxygen partial pressure. For example, when the aluminum oxide has resistance of $2.3\times10^{14}$ $\Omega\cdot$cm, the oxygen partial pressure is 10 mTorr ($\approx$1.3 Pa). When the aluminum oxide has resistance of $2.6\times10^{12}$ $\Omega$ cm, the oxygen partial pressure is 70 mtorr ($\approx$9.3 Pa). Therefore, the amorphous aluminum oxide (see Table 2) can have larger resistance by decreasing the oxygen partial pressure. However, if the oxygen partial pressure drops to approximately $10^{-5}$ torr ($\approx$1.3 mPa) or less, there is such a tendency that the resistance of the amorphous aluminum oxide increases on the contrary. As such, by varying the oxygen partial pressure, amorphous aluminum oxide having desired resistance can be obtained.

[Sixth Embodiment]

The following description explains yet another embodiment of the present invention with reference to FIG. 1 through FIG. 7. Specifically, explanation of difference between the present embodiment and the First embodiment is mainly made. For ease of explanation, materials having the equivalent functions as those shown in the drawings pertaining to the foregoing First through Fifth Embodiments will be given the same reference symbols, and explanation thereof will be omitted here.

In the present embodiment, amorphous aluminum oxide and zinc oxide are layered in accordance with the pulse laser deposition (PLD) method so that an FET 1 (see FIG. 1) is formed.

The FET 1 is an inverse-staggered MOSFET having the same structure as the First Embodiment. Further, functions, materials, and film thickness of an FET substrate 2 and a gate layer 3 in the FET 1 are also the same as those of the First Embodiment, respectively. Therefore, explanation thereof is omitted here.

In the present embodiment, the gate layer 3 is layered on the FET substrate 2, and amorphous aluminum oxide ($Al_2O_3$) is formed as a gate insulating layer 4 on the FET substrate 2 in accordance with the PLD method. A deposition condition is as follows. That is, the KrF excimer laser is used, and its laser power density is 3.0 J/cm$^2$, its laser pulse repetition frequency is 10 Hz. A deposition atmosphere is oxygen, and deposition pressure is 10 mTorr ($\approx$1.3 Pa). An aluminum oxide sintered compact is used as a target. The aluminum oxide has a film thickness of approximately 200 nm.

Next, on the gate insulating layer 4, zinc oxide (ZnO) is formed as the channel layer 5 in accordance with the PLD method. A deposition condition is as follows. That is, the KrF excimer laser is used, and its laser power density is 1.0 J/cm$^2$, its laser pulse repetition frequency is 10 Hz. A deposition atmosphere is oxygen, and deposition pressure is 200 mTorr ($\approx$26.7 Pa). A sintered compact of zinc oxide is used as a target, and the zinc oxide has a film thickness of 5 nm to 100 nm. Note that detail description of the film thickness (hereinafter, referred to as "ZnO film thickness") of the zinc oxide is made later.

The source layer 6 to be a source wire, and the drain layer 7 to be a drain wire are made of aluminum (Al). In the present embodiment, the source layer 6 and the drain layer 7 are made of Al, however, as described in the First Embodiment, the material of them is not particularly limited as long as the material is conductive such as metal, semiconductor, or the like, and allows the source layer 6 and drain layer 7 to make ohmic-contact with the channel layer 5. As also described in the First Embodiment, the source layer 6 and the drain layer 7 may be made of, for example, (i) a metal such as aluminum (Al), molybdenum (Mo), tantalum (Ta), titanium (Ti), silver (Ag), or the like; (ii) a transparent conductive film such as indium tin oxide (ITO), indium zinc oxide (IZO), or the like; or (iii) a conductive film in which an impurity is doped to ZnO; or the like.

Figure 7:
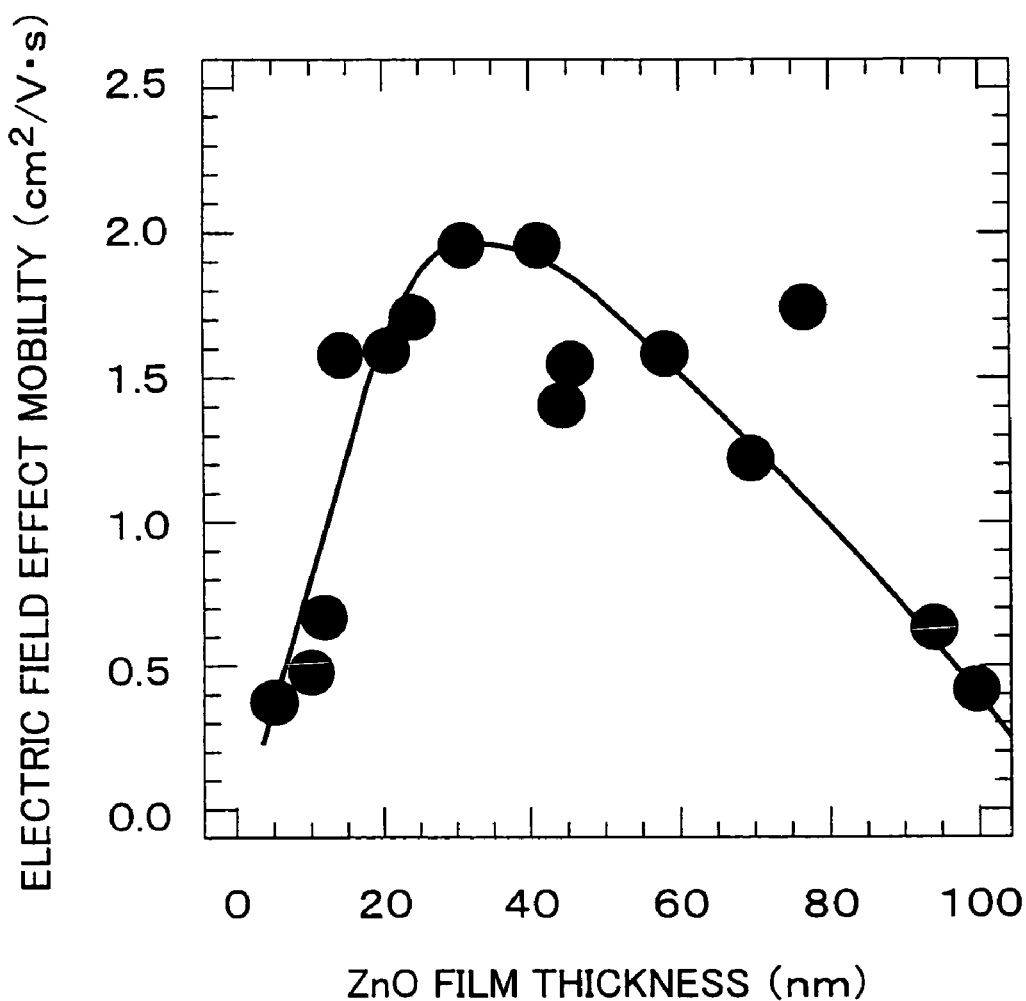
FIG. 7 is a graph illustrating a relation between electric field effect mobility of the FET (see FIG. 1) and a ZnO film thickness.

FIG. 7 illustrates a relation between (i) mobility (electric field effect mobility) of the FET 1 (see FIG. 1) thus manufactured according to the foregoing steps and (ii) film thickness of the zinc oxide (hereinafter, referred to as "ZnO film thickness"). Note that a condition of measuring the mobility of the FET 1 was the same as that of the First Embodiment, except that the gate insulating layer 4 and the channel layer 5 were formed in accordance with the PLD method as described above, and that the film thickness of the channel layer 5 was changed at every measurement as described below. Note also that, for the gate insulating layer 4, aluminum oxide having resistance of $2.4\times10^{14}$ $\Omega\cdot$cm was used.

As shown in FIG. 7, the field effect mobility increases as the ZnO film thickness increases. The field effect mobility reaches its maximum when the ZnO film thickness is approximately 30 nm. However, in the case where the ZnO film thickness further increases, the field effect mobility decreases.

No problem arises in practical use of a thin film transistor in which amorphous silicon is used if its field effect mobility is around 0.35 cm$^2$/V·s, is more preferably around 0.5 cm$^2$/V·s. However, the field effect mobility is desirably 1.0 cm$^2$/V·s or greater, and is more desirably 1.5 cm$^2$/V·s or greater. As shown in FIG. 7, in the case where the thin film transistor including ZnO has field effect mobility of 0.35 cm$^2$/V·s or greater, the thin film transistor has a ZnO film thickness of 5 nm to 100 nm. Therefore, as shown in FIG. 7, in terms of practical use, a lower limit of the ZnO film thickness of the thin film transistor including ZnO is preferably 5 nm or greater, and is more preferably 10 nm or greater, and is further preferably 15 nm or greater, and particularly preferably 20 nm or greater. As also shown in FIG. 7, in terms of practical use, an upper limit of the ZnO film thickness is preferably 100 nm or less, and is more preferably 90 nm or less, and is further preferably 80 nm or less, and is particularly preferably 60 nm or less. Further, because the field effect mobility reaches substantially its maximum value when the ZnO film thickness is in a range of 30 nm to 40 nm as shown in FIG. 7, the ZnO film thickness is the most preferably within a range from 30 nm to 40 nm. With this arrangement, high electric field effect is obtained.

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below.

INDUSTRIAL APPLICABILITY

In order to improve performance of a semiconductor apparatus whose semiconductor layer contains a group II oxide such as zinc oxide, a semiconductor apparatus of the present invention is so arranged that amorphous aluminum oxide is layered on at least one surface of the semiconductor layer. The arrangement allows the semiconductor apparatus to have performance equivalent to a semiconductor apparatus in which all the layered films are crystalline. Such performance cannot be obtained without the amorphous aluminum oxide film.

Therefore, it is possible to realize a semiconductor apparatus (i) in which crystallinity improvement of the semiconductor layer is less required than a conventional semiconductor apparatus; (ii) in which the films can be formed with ease; and (iii) in which a group II oxide that can be used in a large substrate with ease is used for the semiconductor layer. Further, it is possible to realize a semiconductor apparatus which has such freedom in designing that order of forming films is not fixed.

Further, particularly in the case where the group II oxide is zinc oxide, the combination of the amorphous aluminum oxide and the zinc oxide dramatically reduces a defect level at an interface between a gate insulating layer and the channel layer. This ensures further performance improvement of the semiconductor apparatus. A threshold shift, which is due to the defect in the interface between the gate insulating layer and the channel layer, of electric properties of the transistor is suppressed to substantially 0 volt as a result of this combination.

As described above, because the semiconductor apparatus allows easy film forming, and can be adopted for a large substrate with ease, the semiconductor apparatus is suitably applicable to a display apparatus such as a liquid crystal display apparatus, in particular to a large display apparatus.

The invention claimed is:

1. A semiconductor apparatus including a semiconductor layer that contains a group II oxide, comprising:
 a layer made of amorphous aluminum oxide, on at least one surface of and directly contacting the semiconductor layer.

2. The semiconductor apparatus as set forth in claim 1, wherein: the group II oxide is zinc oxide.

3. The semiconductor apparatus as set forth in claim 1, wherein: the semiconductor layer is made of zinc oxide, and has a film thickness not less than 5 nm but not more than 100 nm.

4. The semiconductor apparatus as set forth in claim 1, wherein: the amorphous aluminum oxide has resistance not less than $1\times10^4$ $\Omega$·cm and not more than $2\times10^{17}$ $\Omega$·cm.

5. A display apparatus, comprising: the semiconductor apparatus as set forth in claim 1.

6. A semiconductor apparatus comprising:
 a semiconductor layer that contains a group II oxide; and
 a layer comprising amorphous aluminum oxide provided on and directly contacting at least one surface of the semiconductor layer.

7. The semiconductor apparatus of claim 6, wherein the semiconductor layer forms the channel of a transistor, and the layer comprising amorphous aluminum oxide is a gate insulating layer of the transistor.

8. The semiconductor apparatus of claim 6, wherein the group II oxide is zinc oxide.

9. The semiconductor apparatus of claim 6, wherein the semiconductor layer comprises zinc oxide and has a film thickness not less than 5 nm but not more than 100 nm.

10. The semiconductor apparatus of claim 6, wherein the amorphous aluminum oxide has resistance not less than $1\times10^4$ $\Omega$·cm and not more than $2\times10^{17}$ $\Omega$·cm.

11. A liquid crystal display apparatus comprising the semiconductor apparatus as set forth in claim 6, wherein the semiconductor layer forms the channel of a transistor, and the layer comprising amorphous aluminum oxide is a gate insulating layer of the transistor.

12. The semiconductor apparatus of claim 1, wherein the layer made of amorphous aluminum oxide is an insulating layer.

13. The semiconductor apparatus of claim 6, wherein the layer comprising amorphous aluminum oxide is an insulating layer.

* * * * *